US011222670B2

(12) United States Patent
Gupta et al.

(10) Patent No.: US 11,222,670 B2
(45) Date of Patent: Jan. 11, 2022

(54) CIRCUIT ARCHITECTURE TO DERIVE HIGHER MUX FROM LOWER MUX DESIGN

(71) Applicant: Arm Limited, Cambridge (GB)

(72) Inventors: Lalit Gupta, Cupertino, CA (US); Nicolaas Klarinus Johannes Van Winkelhoff, Roquefort-les-pins (FR); El Mehdi Boujamaa, Valbonne (FR); Bo Zheng, Cupertino, CA (US); Fakhruddin Ali Bohra, San Jose, CA (US); Cyrille Nicolas Dray, Antibes (FR); Ashish Bhardwaj, Noida (IN); Durgesh Kumar Dubey, Noida (IN)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/709,687

(22) Filed: Dec. 10, 2019

(65) Prior Publication Data

US 2021/0110851 A1    Apr. 15, 2021

(30) Foreign Application Priority Data

Oct. 14, 2019    (IN) .............................. 201941041459

(51) Int. Cl.
*G11C 7/00* (2006.01)
*G11C 7/10* (2006.01)
*G11C 8/08* (2006.01)
*G11C 8/10* (2006.01)

(52) U.S. Cl.
CPC .............. *G11C 7/1012* (2013.01); *G11C 8/08* (2013.01); *G11C 8/10* (2013.01)

(58) Field of Classification Search
CPC ............ G11C 7/1012; G11C 8/08; G11C 8/10
USPC ..................................................... 365/189.02
See application file for complete search history.

(56) References Cited

U.S. PATENT DOCUMENTS

| 6,141,779 | A  * | 10/2000 | Hill ...................... | G11C 29/802 |
| | | | | 365/200 |
| 6,507,531 | B1 * | 1/2003 | Zhang ...................... | G11C 8/10 |
| | | | | 365/230.02 |
| 7,079,426 | B2 * | 7/2006 | Zhang ...................... | G11C 5/14 |
| | | | | 365/189.02 |
| 7,403,426 | B2 * | 7/2008 | Hamzaoglu ........... | G11C 11/413 |
| | | | | 365/185.23 |
| 9,899,070 | B2 * | 2/2018 | Kirsch ...................... | G11C 8/10 |

* cited by examiner

*Primary Examiner* — Tha-O H Bui
(74) *Attorney, Agent, or Firm* — Pramudji Law Group PLLC; Ari Pramudji

(57) ABSTRACT

Various implementations described herein are directed to an implementation of a higher order multiplexer using lower order multiplexers. In an embodiment, the implementation requires a slight modification to the existing circuitry design of the lower multiplexers. A plurality of multiplexers may be coupled with each other such that a common input port and output port is formed. Using an enable signal, only one of the coupled multiplexers may be enabled at a time while the remaining multiplexers are switched off. Therefore, upon receiving a select signal indicating an address of a memory cell, the lower multiplexers coupled together function as a higher order multiplexer in selecting the appropriate column corresponding to the memory cell.

20 Claims, 7 Drawing Sheets

US 11,222,670 B2

CIRCUIT ARCHITECTURE TO DERIVE HIGHER MUX FROM LOWER MUX DESIGN

CROSS-REFERENCE TO RELATED APPLICATIONS

This application claims the benefit of and priority to Indian patent application number 201941041459, filed 2019 Oct. 14 and titled CIRCUIT ARCHITECTURE TO DERIVE HIGHER MUX FROM LOWER MUX DESIGN, the disclosure of which is incorporated herein in its entirety.

BACKGROUND

This section is intended to provide information relevant to understanding the various technologies described herein. As the section's title implies, this is a discussion of the related art that should in no way imply that it is prior art. Generally, related art may or may not be considered prior art. It should therefore be understood that any statement in this section should be read in this light, and not as any admission of prior art.

In memory circuit designs, multiplexers are often utilized for selection of a particular address in an array of memory cells. Multiplexers facilitate transfer of content from one of the multiple input data lines to an output line based on the value of one or more input selector signals. The size of multiplexers is determined based on the number of input data lines. For example, a multiplexer capable of selecting 1 output from 32 input data lines is referred to as 32:1 mux. A higher order multiplexer (also referred to as a higher mux) is simply a multiplexer that receives a larger number of input data lines in comparison to another multiplexer. For instance, a 64:1 mux is a higher order multiplexer in comparison to a 32:1 mux. The size of the multiplexers can also indicate the number of input selector lines required: number of input data lines=$2^{input\ selector\ lines}$. As such, a 32:1 mux requires 5 input selector lines.

It is often desirable to use larger size multiplexers in the circuit designs. Conventionally, lower order multiplexers are combined in order to derive a higher order multiplexers. However, the traditional methods require a new design of the circuitry and, therefore, new manufacturing, verification, and packaging process. Such approach will result in an inefficient development and an expensive product. Therefore, there exist a need for an improved circuit design that allows for derivation of higher order multiplexers from lower order multiplexers without the requirement to substantially change the baseline circuitry design of the lower multiplexers.

BRIEF DESCRIPTION OF THE DRAWINGS

Implementations of various techniques are described herein with reference to the accompanying drawings. It should be understood, however, that the accompanying drawings are for illustration purposes only and various implementations described herein and are not meant to limit embodiments of various techniques described herein.

DETAILED DESCRIPTION

Various implementations described herein are directed to integrated circuit (IC) architecture that enables implementation of higher order multiplexers using lower order multiplexers. Various schemes and techniques described herein may provide for optimized circuit design to implement higher order multiplexers with a limited modification to lower order multiplexer circuitry.

Figure 1B:
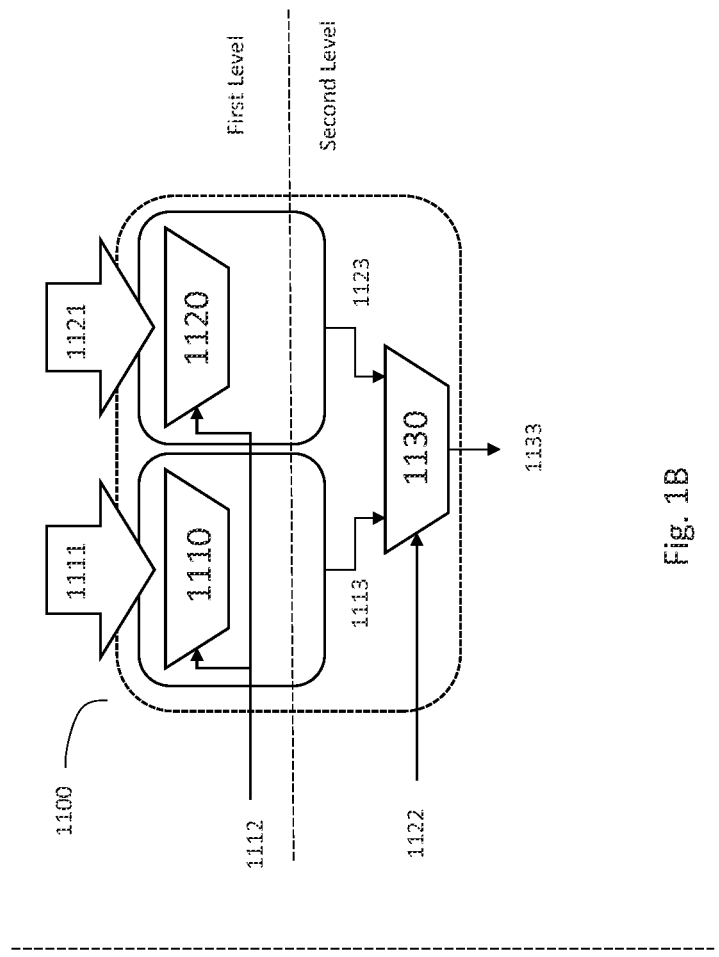
FIGS. 1A and 1B illustrate prior art circuitries to implement higher order multiplexers using lower order multiplexers.
Figure 1A:
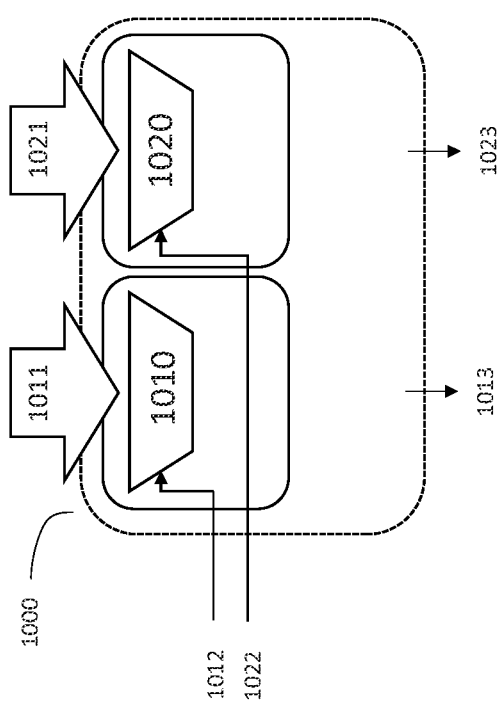

FIGS. 1A and 1B illustrate prior art circuitries to implement higher order multiplexers using lower order multiplexers. More specifically, FIG. 1A shows a circuitry 1000 including a pair of multiplexers 1010 and 1020. The multiplexers 1010 and 1020 receive input data 1011 and 1021 to generate outputs 1013 and 1023 based on the select signals 1012 and 1022 respectively. The number of input data lines depends on the size of the multiplexers. Each of the input data 1011 and 1021 may include a plurality of input data lines. For example, the multiplexers 1010 and 1020 may be 32:1 multiplexers. In such an embodiment, the input data 1011 and 1021 includes 32 input data lines. Furthermore, each of the multiplexers 1010 and 1020 requires a 5-bit address to be communicated by each of the select signals 1012 and 1022 to generate the outputs 1013 and 1023. For example, when the select signal 1012 receives an address location of [00000], the very first input data line from 32 input lines of the input data 1011 is connected to the output line 1013. Multiplexer 1020 also functions similarly.

Referring to FIG. 1B, a conventional method of implementing a higher order multiplexer from a plurality of lower order multiplexers is shown. More specifically, the circuitry 1100 includes a first level and a second level of multiplexers. In comparison to the circuitry 1000 of FIG. 1A, an additional layer of multiplexer 1130 is added to the multiplexers 1110 and 1120. As such, each of multiplexers 1110 and 1120 of the first level selects one output from data input 1111 and 1121. Then, one of the two outputs 1113 and 1123 generated by the multiplexers 1110 and 1120 is selected as the final output 1133 of the circuitry 1100. Therefore, in addition to the first select signal 1112, a second select signal 1122 is required to determine the output of the third multiplexer 1130.

In the conventional design of circuitry 1100, a higher order multiplexer is implemented using two lower order multiplexers. For instance, the multiplexers 1110 and 1120 may be 32:1 multiplexers implementing a 64:1 multiplexer in the circuitry 1100. More specifically, each of the two multiplexers 1110 and 1120 receives 32 input data lines resulting in 64 input data lines together. At the first level of the circuitry 1100 two outputs 1113 and 1123 are selected based on the select signal 1112. Then, on the second level of the circuitry 1100 the final output 1133 is selected based on the select signal 1122. Therefore, one output is generated from 64 data input lines.

However, the challenge with the conventional approach to derive a higher multiplexers from lower multiplexers described above is that it requires a substantial change to existing circuitry design of the lower multiplexers. Such modifications result in a significant cost due to design, manufacturing and verification of the higher mux circuitry. Furthermore, the circuitry requires an additional level of multiplexer which consumes more power and slows down the operation. The subject matters described in this disclosure are directed to addressing these shortcomings.

Figure 2:
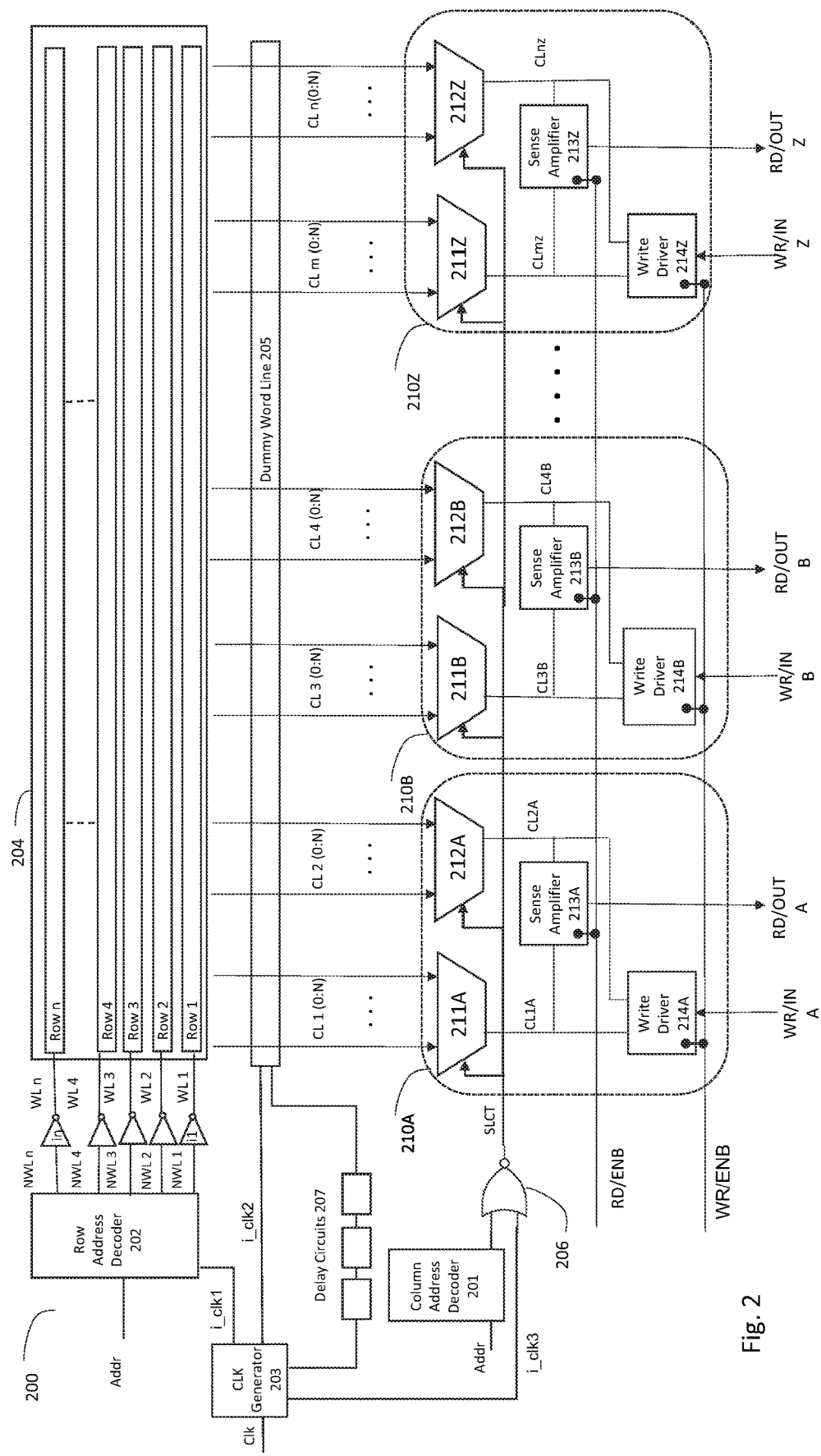
FIG. 2 illustrates a diagram of memory circuitry using lower order multiplexers in accordance with various implementations described herein.

FIG. 2 illustrates a diagram of memory circuitry 200 having multiple multiplexers in accordance with various implementations described herein. The memory circuitry 200 may be implemented as a system or a device having various circuit components that are arranged and coupled together as an assemblage or combination of parts that provide for a physical circuit design and related structures. Also, a method of designing, providing and building the memory circuitry 200 may involve use of the various circuit components described herein so as to thereby implement the various multiplexer design schemes and techniques associated therewith.

As shown in FIG. 2, the memory circuitry 200 may include various components including a column address decoder 201, a row address decoder 202, a clock generator 203, a memory array 204, and a dummy wordline (DWL) 205. The memory circuitry 200 also includes a plurality of column selector units 210A to 210Z (herein 210 denotes the column selector units in plurality). The memory array 204 includes multiple rows of wordlines (i.e. row 0, row 1, row 2, . . . , row n) and multiple columns (i.e. CL 1, CL 2, . . . , CL n). The memory array 204 may be formed by a plurality of memory cells at the intersection of the memory columns and rows. In an embodiment, the columns correspond to bit lines of the memory array. In another embodiment, one half of the columns is source lines and the other half is bit lines, where each memory cell is connected to both a bit line and a source line at an intersection with a wordline. Yet in another embodiment, the memory cells are connected to complimentary bit lines (BL and NBL).

The column selector units 210 may be coupled to each of the memory cells in each of the rows (i.e. row 1, row 2, row 3, . . . , row n) via the columns (CL 1, CL 2, . . . CL n). The memory circuitry 200 may also include a number of inverted wordlines (e.g., nwl 1, nwl 2, nwl 3, . . . , nwl n) that are coupled between the row address decoder 202 and the corresponding rows of memory cells (i.e. row 1, row 2, row 3, . . . , row n) for access to each of the memory cells based on a selected wordline (e.g., wl 1, wl 2, wl 3, . . . , wl_n). Each of the inverted wordlines (nwl_0, nwl_1, nwl_2, . . . , nwl_n) have a corresponding wordline driver (e.g., inverters i1, i2, . . . , in) coupled thereto to provide wordlines signals to the corresponding rows of memory cells.

The memory circuitry 200 may receive a clock signal CLK and an address signal Addr. The clock signal generator 203 may receive the clock signal CLK and generate one or more internal clock signals accordingly. For example, a first internal clock signal i_clk1 is provided by the clock signal generator 203 to the row address decoder 202. The row address decoder 202 may also receive the address signal Addr to access at least one wordline (e.g., wl 1, wl 2, wl 3, . . . , wl n) accordingly. A second internal clock signal i_clk2 generated by the clock signal generator 203 may be provided to a dummy wordline driver (e.g., inverter id) via a dummy wordline 205 (DWL). The signal is then returned to the clock signal generator 203 after going through a plurality of delay circuitry 207.

Finally, a third internal clock signal i_clk3 is provided by the clock signal generator 203 to the plurality of column selector units 210. In an embodiment, a NOR gate 206 receives the address signal Addr decoded by the column address decoder 201 and the clock signal i_clk3 by the clock signal generator 203 to generate the select signal SLCT. The select single SLCT is communicated to each of the column selector units 210. The column selector units 210 comprise of a pair of multiplexers including first multiplexers 211A, 211B, . . . , 211Z (herein 211 denotes the first multiplexers in plurality) and second multiplexers 212A, 212B, . . . , 212Z (herein 212 denotes the second multiplexers in plurality). The column selector units 210 also include sense amplifiers 213A, 213B, . . . , 213Z (herein 213 denotes the sense amplifiers in plurality) generating read output signals RD/OUT A, RD/OUT B, . . . , and RD/OUT Z (herein RD/OUT denotes the read output signals in plurality). The column selector units 210 also include write drivers 214A, 214B, . . . , 214Z (herein 214 denotes the write drivers in plurality) receiving write input signals WR/IN A, WR/IN B, . . . , and WR/IN Z (herein WR/IN denotes the write input signals in plurality).

In one embodiment, each pair of the multiplexers 211 and 212 within the column selector unit 210 corresponds to a subset of columns in the memory array 204. The select signal SLCT received by the multiplexers 211 and 212 may provide an address of one column among the subset of columns for each of the multiplexers 211 and 212. For example, CL 1 indicates the subset of columns received by the multiplexer 211A while (0:N) indicates the number of data input lines (i.e. N is a number such as 4, 8, 16, 32, and etc.). Column CL1A is the selection of the multiplexer 211A from the subset CL 1 (0:N) based on the select signal SLCT. Column CL2A is a selection of the multiplexer 212A from the subset CL 2 (0:N) based on the select signal SLCT. Similarly, the remaining multiplexers 211B, 212B, . . . , 211Z, and 212Z produce columns CL3B, CL4B, . . . , CLmz, and CLnz as output based on the select signal SLCT.

During a read operation, the read enable signal RD/ENB controls the read operation by communicating an enabling signal to the sense amplifiers 213. The enabled sense amplifier receives the selection from the corresponding multiplexers and generates an output on the read output signal RD/OUT accordingly. Similarly, during a write operation, the write enable signal WR/ENB controls the write operation by communicating an enabling signal to the write drivers 214. The enabled write driver receives an input from the write input signal WR/IN and stores it on the memory cell corresponding to the selected column by the multiplexers.

For example, the multiplexers 211 and 212 of the column selector unit 210 may be 32:1 multiplexers. As such, in an embodiment, each of the multiplexers is connected to 32 columns of the memory array 204 (i.e. CL 1 (0:31)). The select signal SLCT may communicate a 5-bit address such that the first column is selected by [00000] address and the last column is selected by [11111] address. Therefore, during the read operation enabled by read enable signal RD/ENB, the read output signal RD/OUT may generate the data stored in a memory cell corresponding to the column selected by the select signal SLCT. Similarly, during the write operation enabled by write enable signal WR/ENB, the write input signal WR/IN may receive a data to store in a memory cell corresponding to the column selected by the select signal SLCT.

In various implementations, each memory cell in the memory arrays 204 may be referred to as a bitcell, and also, each bitcell may be configured to store at least one data bit value (e.g., a data value associated with logical '0' or '1'). Each row of bitcells row_1, row_2, . . . , row_n in the memory array 204 may include any number of bitcells (or memory cells) that are arranged in various configurations, such as, e.g., a two-dimensional (2D) memory array having any number of columns (Ncolumns) and any number of rows (Nrows) of multiple bitcells arranged in a 2D grid pattern with indexing capabilities. Each bitcell may be implemented with any type of memory, including, e.g., dual-port memory, single-port memory, static random access memory (SRAM), magneto-resistive RAM (MRAM), and/or any other type of memory. For instance, each bitcell may include a multi-transistor static RAM (SRAM) cell, including various types of SRAM cells, such as, e.g., 6T CMOS SRAM and/or any other type of complementary MOS (CMOS) SRAM cells, such as, e.g., 4T, 8T, 10T, or more transistors per bit. In other instances, each bitcell may include a multi-layer MRAM bitcell having free-layers and pinned layers, e.g., when tracking is needed on an associated CLK2Q path.

The memory circuitry 200 including each bitcell in the memory array 204 may be implemented as an integrated circuit (IC) with various types of memory circuitry, such as, e.g., dual-port, single-port, SRAM, MRAM, and/or any other type of memory, including any type of volatile and non-volatile memory. The memory circuitry 200 may be implemented as an IC with single and/or dual rail memory architectures, and the memory circuitry 200 may be integrated with computing circuitry and various related components on a single chip. Further, the memory circuitry 200 may be implemented in an embedded system for electronic, mobile, biometric and/or IoT (Internet-of-Things) applications.

The memory circuitry 200 consists of a plurality of leaf cells (unit cells), the basic structure of an integrated circuit, repeated and connected together in such a fashion to form the desired circuitry. Such a design goes through an intensive verification process to be tested for performance. Furthermore, the development of a manufacturing process for this particular design is quite time consuming and expensive. In order to derive higher multiplexers from the low multiplexers presented in the memory circuitry 200 based on conventional approach described with respect to FIGS. 1A and 1B, the entire design and manufacturing process have to change. As such, it is desirable to achieve higher multiplexers making minimum modification to the base design presented in FIG. 2.

Various implementations of deriving a higher order multiplexer design will be described in detail herein with reference to FIGS. 3-6.

Figure 3:
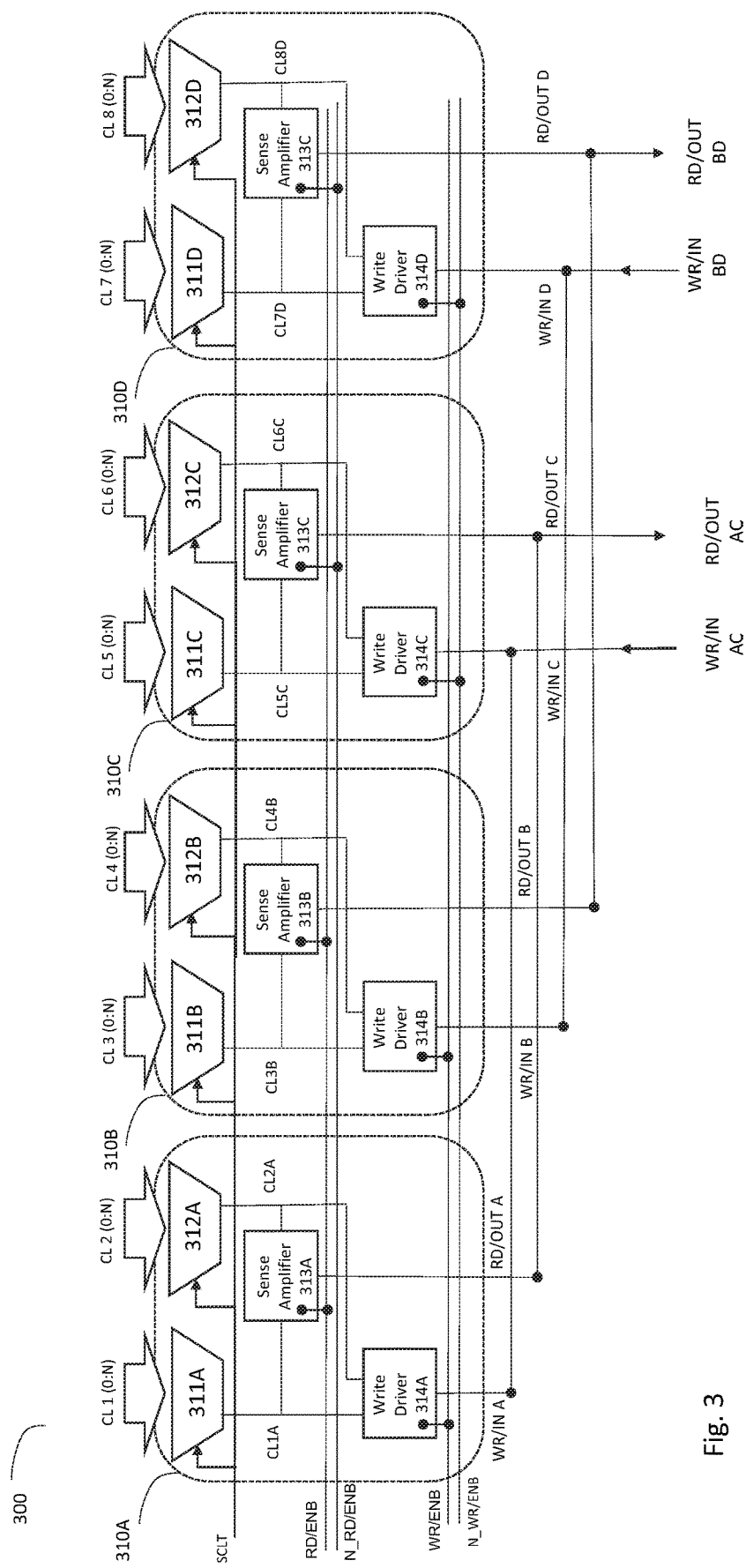
FIG. 3 illustrates a diagram of memory circuitry to implement higher order multiplexers using lower order multiplexers in accordance with an embodiment of the disclosure described herein.

FIG. 3 illustrates a diagram of memory circuitry to implement higher order multiplexers using lower order multiplexers in accordance with an embodiment of the disclosure described herein. As shown in FIG. 3, the base design of the memory circuitry 300 is very similar to the memory circuitry 200 of FIG. 2. In fact, many of the repeated elements such as the clock signal generator, row address decoder, memory array, and dummy wordline have been eliminated in FIG. 3 for the sake of brevity. Otherwise, these eliminated elements are present in the design of memory circuitry 300 and function substantially in the same way as in the memory circuitry 200.

Furthermore, just like the memory circuitry 200 of FIG. 2, the memory circuitry 300 includes a plurality of column selector units 310. The column selector units 310 may include the two multiplexers 311 and 312 (one for the bit lines and one for the source lines), sense amplifiers 313, and write drivers 314. In other embodiments, only a single multiplexer is needed in each of the column selector units. A subset of columns may be assigned to each of the multiplexers 311 and 312. In an embodiment, the multiplexers are coupled together in order to implement higher order multiplexers. For instance, the multiplexers 311A and 312A in column selector unit 310A may be paired with the multiplexers 311C and 312C of the column selector unit 310C. Similarly, the multiplexers 311B and 312B in the column selector unit 310B may be paired with the multiplexers 311D and 312D of the column selector unit 310D. In other instances, more than two column selector units may be coupled together to form a higher order multiplexer.

In an embodiment, the coupled column selector units 310A and 310C also 310B and 310D are connected to an enable signal such that only one of the coupled column selector units, for example, either 310A or 310C, is switched on at a time. In case of coupling a pair of multiplexers, a single bit size is required to be communicated by the enable signal. For instance, one of the column selector units 310A may be connected to the enable signal RD/ENB and WR/ENB while the other one 310C may be connected to the inverted enable signal N_WR/ENB or N_RD/ENB. In an embodiment, the enable signal includes write enable signal WR/ENB and read enable signal RD/ENB. For example, the sense amplifier 313A of the column selector unit 310A is connected to the read enable signal RD/ENB while the sense amplifier 313C of the column selector unit 310C is connected to the inverted read enable signal N_RD/ENB. As such, during the read operation, only one of the column selector units 310A and 310C in the pair may be enabled at a time. Similarly, in other embodiments, the write driver 314A of the column selector unit 310A is connected to the write enable signal WR/ENB while the write driver 314C of the column selector unit 310C is connected to the inverted write enable signal N_WR/ENB. As such, during the write operation, only one of the column selector units in the pair is enabled. The column selector units 310B and 310D are paired to form a higher order multiplexer in a same manner described above with respect to the column selector units 310A and 310C.

In an embodiment, the input ports and output ports of the pair of column selector units are coupled together. For instance, the read output signal RD/OUT AC is coupled to the output ports RD/OUT A and RD/OUT C of both sense amplifiers 313A and 313C of the column selector units 310A and 310C. Similarly, the write input signal WR/IN AC is coupled to the input ports RD/OUT A and RD/OUT C of both write driver 314 A and 314C of the column selector units 310A and 310C. In an embodiment, the read output signal RD/OUT BD may be connected to output ports RD/OUT B and RD/OUT D while write input signal WR/IN BD may be connected to input ports WR/OUT B and WR/OUT D of other column selector units 310B and 310D in the same manner described above with respect to the column selector units 310A and 310C.

In an instance, the multiplexers 311 and 312 may be a 32:1 multiplexers. As such, each of the multiplexers may select one column from a subset of 32 columns and, therefore, they may require a 5-bit address communicated by the select signal SLCT as previously explained. In an embodiment of disclosure, the two 32:1 multiplexers are combined without a substantial modification to the memory circuitry in order to implement 64:1 multiplexers using a one bit status communicated by the enable signals RD/ENB and WR/ENB.

For example, during a write operation, the write input signal WR/IN may receive a value to store in a memory cell corresponding to one of the 64 columns of the memory array. The write input signal WR/IN AC is connected to both of the write drivers 314A and 314C. However, since one of the write drivers 314A and 314C is coupled to the write enable signal WR/ENB while the other one is connected to the inverted write enable signal N_WR/ENB, only one of the drivers will be enabled at a time. For example, if the write driver 314C is enabled, then the input value received by the write input signal WR/IN AC is stored in the memory cell associated with the columns CL5C and CL6C selected by the multiplexers 311C and 312C respectively. The column address is communicated to the multiplexers 311C and 312C by the select signal SLCT to select a bit line from CL 5 (0:N) and a source line from CL 6 (0:N).

In another example, during a read operation, the read output signal RD/OUT may generate a value stored in a memory corresponding to one of the 64 columns of the memory array. The read output signal RD/OUT is connected to both of the sense amplifiers 313A and 313C. However, since one of the sense amplifiers 313A and 313C is coupled to the read enable signal RD/ENB while the other one is connected to inverted read enable signal N_RD/ENB, only one of the sense amplifiers will be enabled at a time. For example, if the sense amplifier 313A is enabled, then the output value generated by read output signal RD/OUT AC is based on the value stored in the memory cell associated with columns CL1A and CL2A selected by the multiplexers 311A and 312A. The column address is communicated to the multiplexers 311A and 312A by the select signal SLCT to select a bit line from CL 1 (0:N) and a source line from CL 2 (0:N).

Figure 4:
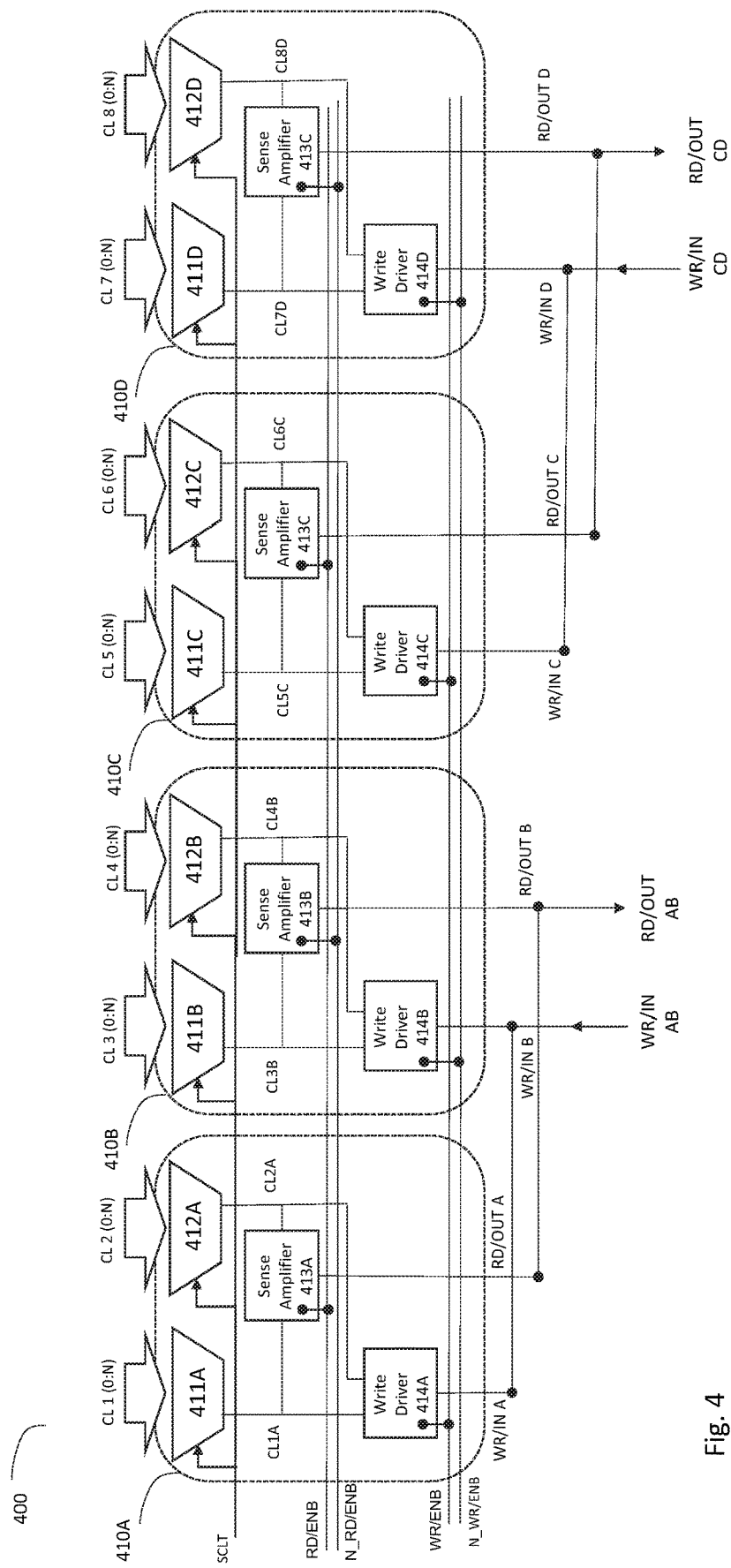
FIG. 4 illustrates a diagram of memory circuitry to implement higher order multiplexers using lower order multiplexers in accordance with another embodiment of the disclosure described herein.

FIG. 4 illustrates a diagram of memory circuitry to implement higher order multiplexers using lower order multiplexers in accordance with another embodiment of the disclosure described herein. The memory circuitry 400 is an alternative implementation of the memory circuitry 300. In this embodiment, instead of every other column selector units, the units next to each other form a pair to implement a higher order multiplexer. For instance, the column selector units 410A and 410B may form the first pair while the column selector units 410C and 410D may form the second pair of multiplexers. In an embodiment, while the write drivers of the first column selector units of the pair (i.e. 414A and 414C) are connected to the write enable signal WR/ENB, the write drivers of the second column selector units of the pair (i.e. 414B and 414D) are connected to the inverted write enable signal N_WR/ENB. Similarly, in other embodiments, while the sense amplifiers of the first column selector units of the pair (i.e. 413A and 413C) are connected to the read enable signal RD/ENB, the sense amplifiers of the second column selector units of the pair (i.e. 413B and 413D) are connected to the inverted read enable signal N_RD/ENB.

In an embodiment, each pair of the column selector units generate one output and receive one input. For example, the output ports RD/OUT A and RD/OUT B of the first pair of column selector units 410A and 410B are coupled to the read output signal RD/OUT AB. Also, in another embodiment, the input ports WR/IN A and WR/IN B of the first pair of column selector units 410A and 410B are coupled to the write input signal WR/IN AB. In an embodiment, the read output signal RD/OUT CD may be connected to output ports RD/OUT C and RD/OUT D while write input signal WR/IN CD may be connected to input ports WR/IN C and WR/IN D of other column selector units 310C and 310D in the same manner described above with respect to the column selector units 310A and 310B.

In an embodiment, depending on the select signal and enable signal, each of the first pair of column selector units 410A and 410B selects a memory cell corresponding to the columns (e.g., bit lines) CL1A and CL3B selected from the subset of columns CL1 and CL3 and the columns (e.g., source lines) CL2A and CL4B selected from columns CL2 and CL4. Similarly, in another embodiment, depending on the select signal and enable signal, the second pair of column selector units 410C and 410D selects a memory cell corresponding to the columns (e.g., bit lines) CL5C and CL7D selected from columns CL5 and CL7 and the columns (e.g., source lines) CL6C and CL8D selected from columns CL6 and CL8.

Figure 5:
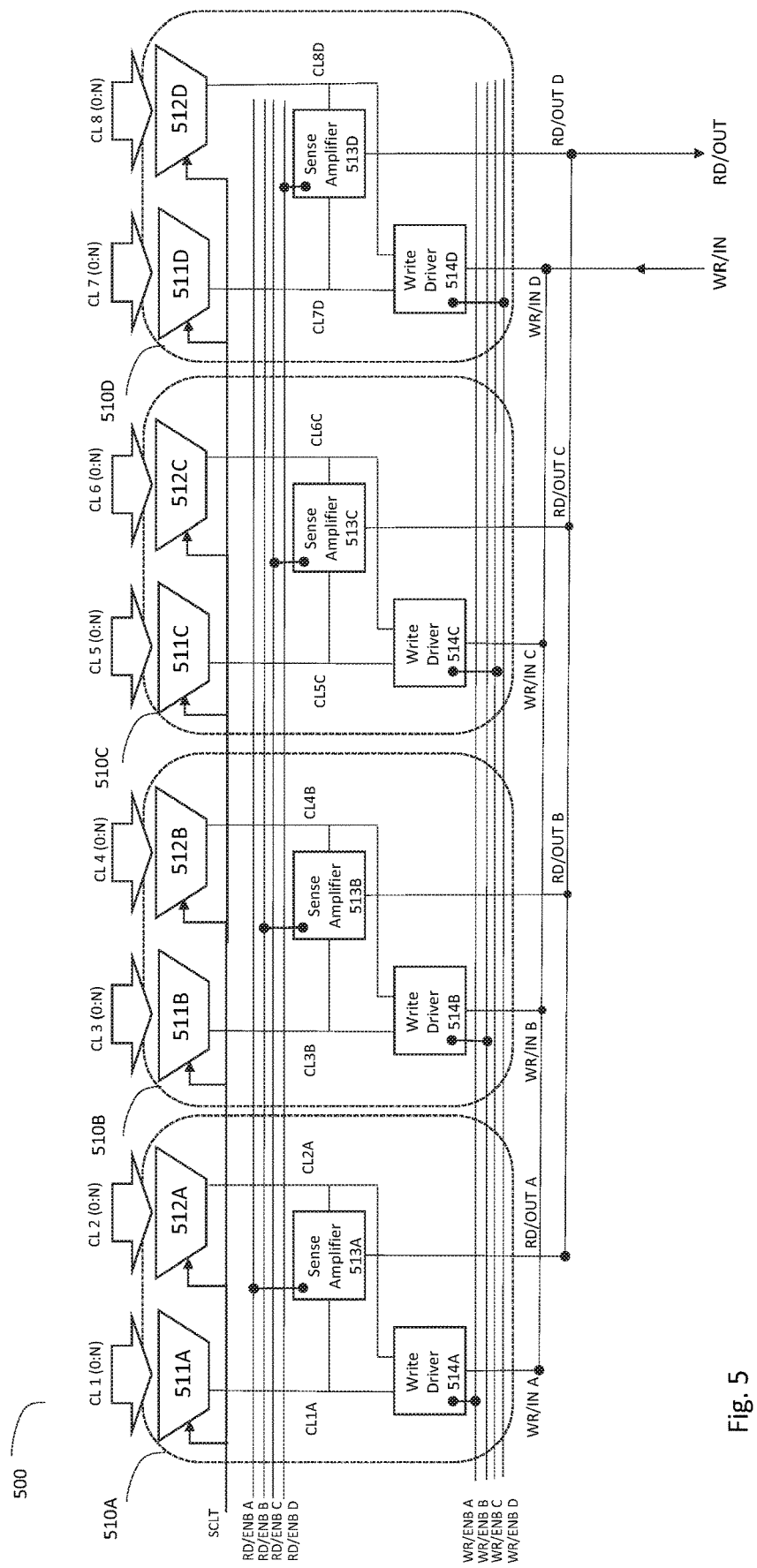
FIG. 5 illustrates a diagram of memory circuitry to implement higher order multiplexers using more than two lower order multiplexers in accordance with yet another embodiment of the disclosure described herein.

FIG. 5 illustrates a diagram of memory circuitry to implement higher order multiplexers using more than two lower order multiplexers in accordance with yet another embodiment of the disclosure described herein. While earlier embodiments described with reference to FIGS. 3 and 4 illustrated forming a higher order multiplexer using a pair of lower order multiplexers, the memory circuitry 500 of FIG. 5 describes an embodiment where a plurality of multiplexers (more than two) are used to form a higher order multiplexer. For instance, four multiplexers of order 4:1 may be combined according to the methods disclosed to implement a 16:1 multiplexer.

In an embodiment, the base of the circuit design for memory circuitry 500 is the same as the memory circuitries described previously with reference to FIGS. 2-4. The memory circuitry 500 includes a plurality of column selector units 510. The column selector units 510 include pairs of multiplexers 511 and 512, sense amplifiers 513, and write drivers 514. In an embodiment, the memory circuitry 500 includes only one read output signal RD/OUT and only one write input signal WR/IN. In an embodiment, the read output signal RD/OUT is coupled to the output ports RD/OUT A, RD/OUT B, RD/OUT C, and RD/OUT D, corresponding to all of the sense amplifiers 513, while the write input signal WR/IN is connected to the input ports WR/IN A, WR/IN B, WR/IN C, and WR/IN D, corresponding to all of the write drivers 514.

In an embodiment, the size of the select signal SLCT depends on the order of multiplexers 511 and 512. The disclosure is not limited to particular size of multiplexers, and as such, the size of the select signal may be as large as necessary by the design. For instance, if the size of the subset of columns assigned to each multiplexer is 4, then the size of the select signal SLCT may be at least 2 bits. On the other hand, the size of the enable signals (write enable signal and read enable signal) depends on the number of column selector units or the number of multiplexers. The disclosure is also not limited to a particular number of column selector units, and as such, the size of the enable signal can be as large as necessary by the design. For instance, in the case of 4 column selector units the enable signal may be at least two bits.

In an embodiment, the read enable signal RD/ENB is connected to each of the sense amplifiers 513 in the column selector units 510 to control the read operation. In an embodiment, only one of the column selector units 510 can be switched on for the read operation at a time. In an embodiment, when one of the column selector units 510 is enabled for read operation the remaining column selector units 510 are disabled. Similarly, the write enable signal is connected to each of the write drivers 514 in the column selector units 510 to control the write operation. In an embodiment, only one of the column selector units 510 can be switched on for write operation at a time. In an embodiment, when one of the column selector units 510 is enabled for write operation the remaining column selector units 510 are disabled.

In an embodiment, the pair of multiplexers 511 and 512 within the column selector units 510 receives a selection of a particular column. For instance, the select signal SCLT may communicate an address of two bits, for example, the address [00] to the multiplexers 511 and 512 with 4 input data lines (i.e. columns). The address indicates the first column CL (0) among the four columns CL (0:3) are selected by each of the multiplexers 511 and 512. However, during the read operation, only one of the sense amplifiers 513 may be switched on by the read enable signal RD/ENB. For example, the sense amplifier 513B of column selector unit 510B may be turned on by the read enable signal RD/ENB B. In this case, all remaining read enable signal RD/ENB A, RD/ENB C, and RD/ENB D switch off their corresponding sense amplifiers 513A, 513 C, and 513D respectively. Therefore, the value of the memory cell corresponding to the selected columns CL3B and CL4B by multiplexers 511B and 512B is communicated through output port RD/OUT B to read output signal (RD/OUT).

Similarly, in another embodiment, during a write operation, the select signal SCLT may communicate an address of two bits, for example, the address [10] to the multiplexers 511 and 512 with 4 input data lines (i.e. columns). The address indicates the third column CL (2) among the four columns CL (0:3) are selected by each of the multiplexers 511 and 512. However, during the write operation, only one of the write drivers 514 is switched on by write enable signal WR/ENB. For example, the write drivers 514C of column selector unit 510C may be turned on by the write enable signal WR/ENB C. In this case, all remaining write enable signals WD/ENB A, WD/ENB B, and WR/ENB D switch off their corresponding write drivers 514A, 514B, and 514D respectively. Therefore, the value received by the write input signal WR/IN is communicated through input port WR/IN C to the memory cell corresponding to the selected columns CLSC and CLEC by multiplexers 511C and 512C.

Figure 6:
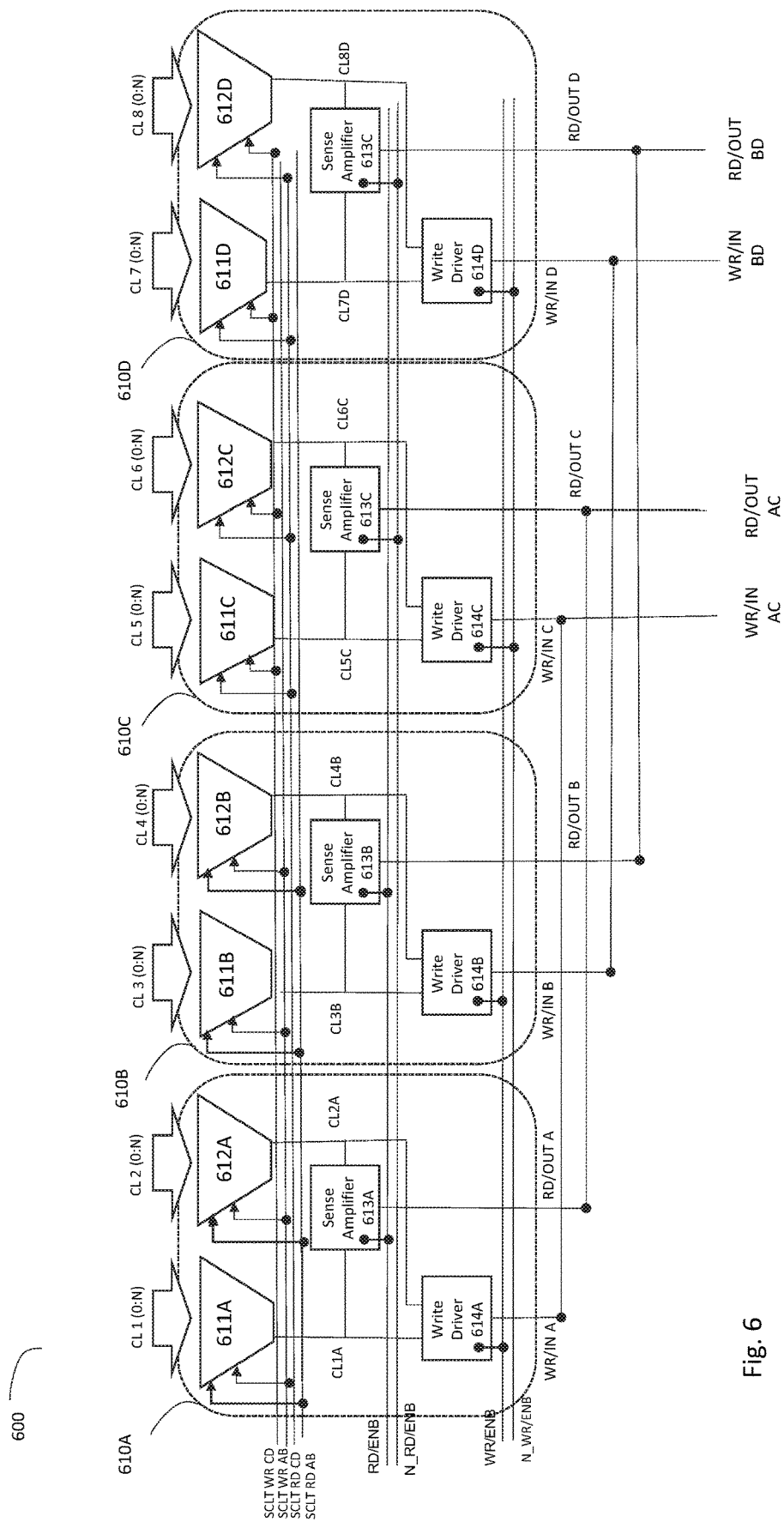
FIG. 6 illustrates a diagram of memory circuitry to implement higher order multiplexers using lower order multiplexers with designated select signals in accordance with yet another embodiment of the disclosure described herein.

FIG. 6 illustrates a diagram of memory circuitry to implement higher order multiplexers using lower order multiplexers with designated select signals in accordance with yet another embodiment of the disclosure described herein. The memory circuity 600 is an alternative implementation of the memory circuitry 300. Referring back to FIG. 3, the select signal SLCT is communicated to all multiplexers 311 and 312 within the column selector units 310 regardless of them being enabled or not. For instance, while write enable signal WR/ENB may have only switched on column selector units 310A and 310B, the select signal SLCT is still communicated to all four column selector units, even 310C and 310D that are switched off. Such a design may impose a large loading on the select signal SLCT and, therefore, cause slowness in the communication.

Referring back to FIG. 6, in an embodiment, designated select signals are defined based on the multiplexers that are currently enabled. In an embodiment, the designated select signals include select signals for read and write operations. For example, the select signal SLCT RD AB communicates an address of a column to each of the multiplexers of the column selector units 610A and 610B when enabled by the read enable signal RD/ENB. Similarly, the select signal SLCT WR AB communicates an address of a column to each of the multiplexers of the column selector units 610A and 610B when enabled by the write enable signal WR/ENB. The select signals SLCT RD CD and SLCT WR CD function in the same way for the column selector units 610C and 610D.

For instance, when implementing a 64:1 multiplexer using a pair of 32:1 multiplexers, there may be four select signals. In FIG. 6, considering column selector units 610A and 610C only, a first select signal SLCT RD AB is designated to provide a column address during a read operation on memory cell selected by the pair of multiplexers 611A and 612A. A second select signal SLCT WR AB is designated to provide a column address during a write operation on memory cell selected by the pair of multiplexers 611A and 612A. A third select signal SLCT RD CD is designated to provide a column address during a read operation on memory cell selected by the pair of multiplexers 611C and 612C. A forth select signal SLCT WR CD is designated to provide a column address during a write operation on memory cell selected by the pair of multiplexers 611C and 612D.

In an embodiment, the select signals are providing a 5 bit address of a column to the multiplexers. However, the select signal is gated by the enable signals such that the select signal is only communicated when the corresponding multiplexers are enabled by the enable signal.

Figure 7:
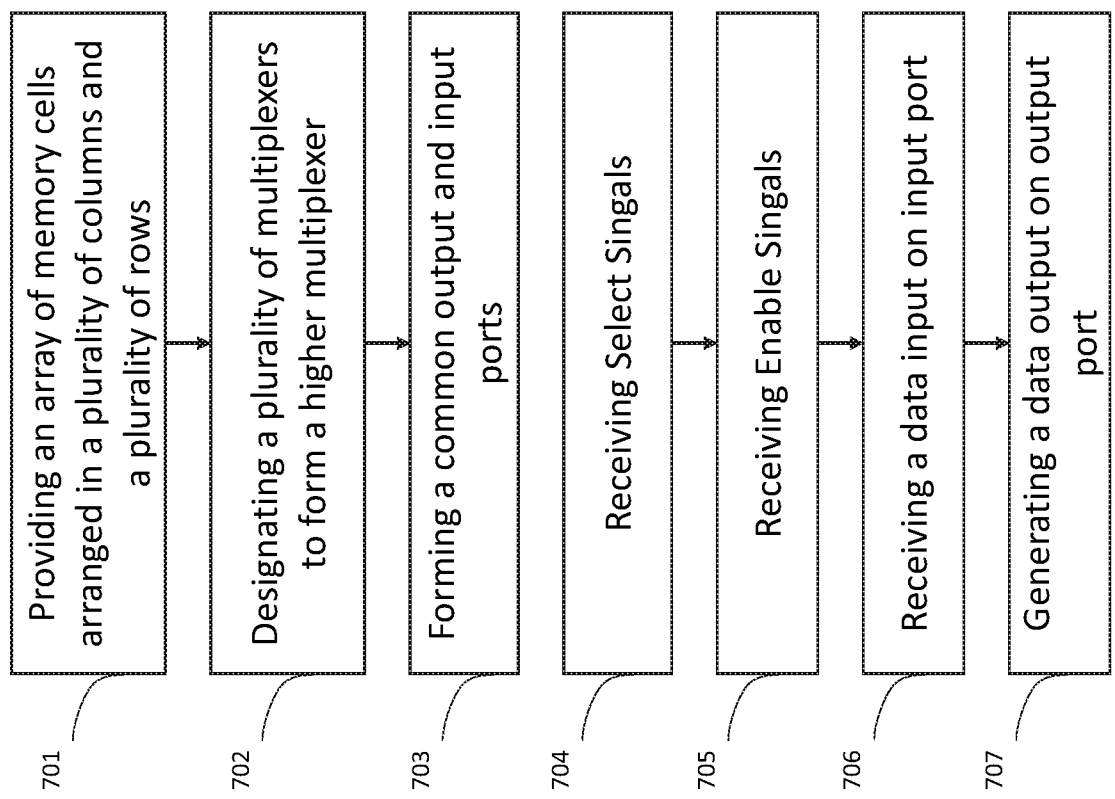
FIG. 7 illustrates a process flow diagram of a method of deriving higher order multiplexers from lower order multiplexers in accordance with an embodiment of the disclosure described herein.

FIG. 7 illustrates a process diagram of a method 700 for providing memory circuitry in accordance with various implementations described herein.

It should be understood that even though method 700 may indicate a particular order of operation execution, in some cases, various certain portions of the operations may be executed in a different order, and on different systems. In other cases, additional operations and/or steps may be added to and/or omitted from method 700. Also, method 700 may be implemented in hardware and/or software. If implemented in hardware, the method 700 may be implemented with various circuit elements, such as described herein above in reference to FIGS. 3-6. If implemented in software, the method 700 may be implemented as a program and/or software instruction process that may be configured for providing a higher multiplexer design techniques as described herein. Also, if implemented in software, instructions related to implementing the method 700 may be stored in memory and/or a database. For instance, a computer or various other types of computing devices having a processor and memory may be configured to perform method 700.

As described and shown in reference to FIG. 7, method 700 may be utilized for fabricating and/or manufacturing, or causing to be fabricated and/or manufactured, an integrated circuit (IC) that implements higher multiplexer design schemes and techniques as described herein that are related to providing higher multiplexer architecture and/or various associated systems, devices, components, circuits and related architecture.

At block 701, method 700 may provide memory circuitry with an array of bitcells arranged in columns and rows. Each bitcell may be connected to one row of a wordline and two columns of a bit line and a source line. A series of multiplexers may be used to select the columns associated with the desired bitcell. In an embodiment, a subset of the plurality of columns are assigned to each multiplexer. The number of columns assigned to each multiplexer depends on the size of the multiplexer.

At block 702, a plurality of multiplexers is designated to form a higher order multiplexer. For example, two 32:1 multiplexers may be selected to form one 64:1 multiplexer. In other instance, four 4:1 multiplexers may be selected to form one 16:1 multiplexer. The base circuit design of the plurality of lower multiplexers may be used with a minimum modification to implement a higher order multiplexer in embodiments of the disclosure.

At block 703, the input ports and output ports corresponding to the plurality of lower multiplexers used to implement a higher order multiplexer are coupled together. The common input port may be used in order to write a data in the bitcell selected by the higher order multiplexers while the common output port is used to generate the data stored in the bitcell selected by the higher order multiplexers.

At block 704, a select signal is received indicating an address of a particular column from the subset of columns assigned the multiplexers. In one embodiment, all multiplexers forming a higher order multiplexer receive the select signal and select one column. In case the memory circuitry includes both bit lines and source lines, the selection of the pair of multiplexers corresponds to the same memory cell. In another embodiment, the select signal is designated such that those multiplexers that are not enabled do not receive the signal. The size of the select signal depends on the size of the multiplexers that being combined to form a higher order multiplexer.

At block 705, an enable signal is received by the multiplexers to switch on one particular multiplexer among the plurality while turning other multiplexers off. In an embodiment, the enable signal includes a write enable signal and a write enable signal. Number of bits communicated by the enable signal depends on the number multiplexers coupled together to form a higher order multiplexer. The read enable signal may be communicated to a sensor amplifier while the write enable signal may be communicated to a write driver corresponding to the multiplexer.

At block 706, a data is received on common input port to be stored on a selected memory cell. The select signal selects one column at each of the plurality multiplexers. The write enable signal switches on one of the plurality of the multiplexers. Therefore, the data is stored on a memory cell corresponding to the column selected based on the select signal by multiplexer enabled based on write enable signal.

At block 707, a data stored in a particular memory cell is produced on the common output port. The select signal selects one column at each of the plurality multiplexers. The read enable signal switches on one of the plurality of the multiplexers. Therefore, the data stored on a memory cell corresponding to the column selected based on the select signal by multiplexer enabled based on read enable signal is generated on output port.

Described herein are various implementations of a memory circuit. The memory circuit may an array of memory cells arranged in a plurality of columns and a plurality of rows. The memory circuit may include a first cell having a first pair of multiplexers corresponding to a first group of the plurality of columns, a first sense amplifier, and a first write driver. The memory circuit may also include a second cell having a second pair of multiplexers corresponding to a second group of the plurality of columns, a second sense amplifier, and a second write driver. A write enable signal may be configured to enable one of the first driver or the second write driver. A read enable signal may be configured to enable one of the first sense amplifier or the second sense amplifier.

Described herein are various implementations of a memory circuit. The memory circuit may include a memory array having a plurality of memory cells arranged in a plurality of rows and a plurality of columns. The memory circuit may also include a row selector configured to identify a selected row associated with a particular memory cell and a column selector configured to identify a selected column associated with the particular memory cell. The column selector may include a plurality of multiplexers, each corresponding to a subset of the plurality of columns. The column selector may further include an enable signal to switch one of the plurality of multiplexers at a time. Finally, the column selector may also include a select signal to select one column from the subset of the plurality of columns corresponding to the one of the plurality of multiplexers enabled by the enable signal.

Described herein are various methods of implementing a multiplexer. The method may include providing an array of memory cells arranged in a plurality of columns and a plurality of rows, coupling a pair of multiplexers to the plurality of columns, wherein each of the multiplexers in the pair corresponds to a subset of the plurality of columns, forming an output port by coupling output outlets of the pair of multiplexers together, and forming an input port by coupling input outlets of the pair of multiplexers together. The method further includes receiving a select signal by the pair of multiplexers, wherein the select signal translates to a specific column by each multiplexers of the pair of multiplexers, generating an output on the output port in response to a read enable signal, and receiving an input on the input port in response to a write enable signal.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business-related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and Figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A memory circuit, comprising:
   an array of memory cells arranged in a plurality of columns and a plurality of rows;
   a first cell having a first pair of multiplexers corresponding to a first group of the plurality of columns, a first sense amplifier, and a first write driver;
   a second cell having a second pair of multiplexers corresponding to a second group of the plurality of columns, a second sense amplifier, and a second write driver;
   a write enable signal configured to enable one of the first write driver and the second write driver; and
   a read enable signal configured to enable one of the first sense amplifier and the second sense amplifier.

2. The memory circuit of claim 1, further comprising:
   an input signal coupled to the first and second write drivers, wherein during a write operation the input signal is connected to one of the plurality of columns from the first and second groups of the plurality of columns.

3. The memory circuit of claim 1, further comprising:
   an output signal coupled to the first and second sense amplifiers, wherein during a read operation the output signal is connected to one of the plurality of columns from the first and second groups of the plurality of columns.

4. The memory circuit of claim 1, wherein each of the multiplexers in the first pair of multiplexers and the second pair of multiplexers is a 32:1 multiplexer.

5. The memory circuit of claim 4, wherein the first group and the second group of the plurality of columns correspond to 64 bit lines and 64 source lines.

6. The memory circuit of claim 2, further comprising:
   a select signal received by the first pair of multiplexers and second pair of multiplexers, wherein the select signal corresponds to a different column in each of the multiplexers in the first and second pair of multiplexers.

7. The memory circuit of claim 6, wherein the write enable signal enables the first write driver during the write operation, and a value communicated from the input signal is written into a particular memory cell, wherein the particular memory cell corresponds to the first group of the plurality of columns.

8. A memory circuit, comprising:
   a memory array having a plurality of memory cells arranged in a plurality of rows and a plurality of columns;
   a row selector configured to identify a selected row associated with a particular memory cell;
   a column selector comprising a plurality of cells, configured to identify a selected column associated with the particular memory cell, wherein the column selector includes:
     a plurality of multiplexers, each corresponding to a subset of the plurality of columns, wherein each cell of the plurality of cells comprises a pair of multiplexers of the plurality of multiplexers;
     an enable signal to switch one of the plurality of multiplexers at a time; and
     a select signal to select one column from the subset of the plurality of columns corresponding to the one of the plurality of multiplexers enabled by the enable signal.

9. The memory circuit of claim 8, wherein the enable signal comprises a write enable signal to facilitate a write operation and a read enable signal to facilitate a read operation.

10. The memory circuit of claim 9, wherein input ports of the plurality of multiplexers are coupled together to receive one input data during the write operation.

11. The memory circuit of claim 9, wherein output ports of the plurality of multiplexers are coupled together to generate one output data during the read operation.

12. The memory circuit of claim 9, wherein the plurality of multiplexers consists of four number of 4:1 multiplexers, and wherein the plurality of columns is 16.

13. The memory circuit of claim 12, wherein the select signal comprises 2 bits and the enable signal comprises 4 bits.

14. The memory circuit of claim 12, wherein the enable signal results in enabling one of the plurality of multiplexers and disabling the rest of the plurality of multiplexers.

15. A method of implementing a multiplexer, comprising:
   providing an array of memory cells arranged in a plurality of columns and a plurality of rows;
   coupling a pair of multiplexers to the plurality of columns, wherein each of the multiplexers in the pair corresponds to a different subset of the plurality of columns;

forming a common output port by coupling output ports of the pair of multiplexers together;

receiving a select signal by the pair of multiplexers, wherein the select signal is translated to an address of a specific column by each multiplexers of the pair of multiplexers; and generating an output on the common output port in response to a read enable signal.

16. The method of claim 15, further comprising:

forming a common input port by coupling input ports of the pair of multiplexers together; and receiving an input on the common input port in response to a write enable signal.

17. The method of claim 16, wherein the read enable signal enables one of the multiplexers from the pair of multiplexers; and the output is based on the specific column corresponding to the select signal translated by the enabled multiplexer.

18. The method of claim 16, wherein the write enable signal enables one of the multiplexers from the pair of multiplexers; and the input is written on the specific column corresponding to the select signal translated by the enabled multiplexer.

19. The method of claim 16, wherein the write and read enable signals result in enabling one of the multiplexers in the pair of multiplexers and disabling the other multiplexer in the pair of multiplexers.

20. The method of claim 15, wherein each of the multiplexers in the pair of multiplexers is a 32:1 multiplexer, and wherein the select signal is a 1-bit signal and the plurality of columns are 64 columns.

* * * * *